United States Patent
Kwon et al.

(10) Patent No.: US 10,971,209 B1
(45) Date of Patent: Apr. 6, 2021

(54) VHSA-VDDSA GENERATOR MERGING SCHEME

(71) Applicant: SanDisk Technologies LLC, Addison, TX (US)

(72) Inventors: Ohwon Kwon, San Jose, CA (US); Kou Tei, San Jose, CA (US); VSNK Chaitanya G, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/593,576

(22) Filed: Oct. 4, 2019

(51) Int. Cl.
| G11C 11/4074 | (2006.01) |
| G11C 5/14 | (2006.01) |
| G11C 11/56 | (2006.01) |
| G11C 11/4091 | (2006.01) |
| G11C 11/4094 | (2006.01) |

(52) U.S. Cl.
CPC ......... G11C 11/4074 (2013.01); G11C 5/147 (2013.01); G11C 11/4091 (2013.01); G11C 11/4094 (2013.01); G11C 11/5628 (2013.01)

(58) Field of Classification Search
CPC ............................ G11C 11/4074; G11C 5/147
USPC ............................................ 365/189.09, 226
See application file for complete search history.

(56) References Cited

U.S. PATENT DOCUMENTS

| 6,385,119 B2 * | 5/2002 | Kobayashi | G05F 3/242 |
| | | | 365/226 |
| 6,778,460 B1 * | 8/2004 | Jung | G11C 5/147 |
| | | | 365/226 |
| 10,210,913 B2 * | 2/2019 | Park | G11C 7/065 |

* cited by examiner

*Primary Examiner* — Son L Mai
(74) *Attorney, Agent, or Firm* — Dickinson Wright PLLC; Steven Hurles

(57) ABSTRACT

A memory device is provided including physical block circuitry including a first lateral network arrangement and a second lateral network arrangement. Each of the first and second lateral network arrangements includes a single generator configured to output both a sense amplifier voltage VHSA and a data latch voltage VDDSA, in each of a first mode and a second mode. In the first mode, during which read and program verify and other operations may occur, the generator receives VHSA as a feedback signal and in the second mode, during which programming, POR, and EVFY operations may occur, the generator receives VDDSA as a feedback signal.

15 Claims, 6 Drawing Sheets

VHSA-VDDSA GENERATOR MERGING SCHEME

BACKGROUND

1. Field

Apparatuses and methods consistent with example embodiments relate to voltage power supplies for a sense amplifier and a data latch, and more specifically, to a single voltage power supply for both a sense amplifier and a data latch of a non-volatile memory device.

2. Description of the Related Art

Three dimensional (3D) NOT-AND (NAND) flash memory is a type of non-volatile flash memory in which memory cells are stacked vertically in multiple layers. 3D NAND was developed to address challenges encountered in scaling two dimensional (2D) NAND technology to achieve higher densities at a lower cost per bit.

A memory cell is an electronic device or component capable of storing electronic information. Non-volatile memory may utilize floating-gate transistors, charge trap transistors, or other transistors as memory cells. The ability to adjust the threshold voltage of a floating-gate transistor or charge trap transistor allows the transistor to act as a non-volatile storage element (i.e. a memory cell), such as a single-level cell (SLC) which stores a single bit of data. In some cases more than one data bit per memory cell can be provided (e.g., in a multi-level cell) by programming and reading multiple threshold voltages or threshold voltage ranges. Such cells include, but are not limited to a multi-level cell (MLC), storing two bits per cell; a triple-level cell (TLC), storing three bits per cell; and a quad-level cell (QLC), storing four bits per cell.

FIG. 1 illustrates a diagram of an example 3d NAND memory array 260. In this example, the memory array 260 is a 3D NAND memory array. However, this is just one example of a memory array. The memory array 260 includes multiple physical layers that are monolithically formed above a substrate 34, such as a silicon substrate.

Storage elements, for example memory cells 301, are arranged in arrays in the physical layers. A memory cell 301 includes a charge trap structure 44 between a word line 300 and a conductive channel 42. Charge can be injected into or drained from the charge trap structure 44 via biasing of the conductive channel 42 relative to the word line 300. For example, the charge trap structure 44 can include silicon nitride and can be separated from the word line 300 and the conductive channel 42 by a gate dielectric, such as a silicon oxide. An amount of charge in the charge trap structure 44 affects an amount of current through the conductive channel 42 during a read operation of the memory cell 301 and indicates one or more bit values that are stored in the memory cell 301.

The 3D memory array 260 includes multiple blocks 80. Each block 80 includes a "vertical slice" of the physical layers that includes a stack of word lines 300. Multiple conductive channels 42 (having a substantially vertical orientation, as shown in FIG. 1) extend through the stack of word lines 300. Each conductive channel 42 is coupled to a storage element in each word line 300, forming a NAND string of storage elements, extending along the conductive channel 42. FIG. 1 illustrates three blocks 80, five word lines 300 in each block 80, and three conductive channels 42 in each block 80 for clarity of illustration. However, the 3D memory array 260 can have more than three blocks, more than five word lines per block, and more than three conductive channels per block.

Physical block circuitry is coupled to the conductive channels 42 via multiple conductive lines: bit lines, illustrated as a first bit line BL0, a second bit line BL1, and a third bit line BL2 at a first end of the conductive channels (e.g., an end most remote from the substrate 34) and source lines, illustrated as a first source line SL0, a second source line SL1, and a third source line SL2, at a second end of the conductive channels (e.g., an end nearer to or within the substrate 234). The physical block circuitry 252 is illustrated as coupled to the bit lines BL0-BL2 via "P" control lines, coupled to the source lines SL0-SL2 via "M" control lines, and coupled to the word lines 300 via "N" control lines. Each of P, M, and N can have a positive integer value based on the specific configuration of the 3D memory array 260.

Each of the conductive channels 42 is coupled, at a first end to a bit line BL, and at a second end to a source line SL. Accordingly, a group of conductive channels 42 can be coupled in series to a particular bit line BL and to different source lines SL.

It is noted that although each conductive channel 42 is illustrated as a single conductive channel, each of the conductive channels 42 can include multiple conductive channels that are in a stack configuration. The multiple conductive channels in a stacked configuration can be coupled by one or more connectors. Furthermore, additional layers and/or transistors (not illustrated) may be included as would be understood by one of skill in the art.

Among other things, the physical block circuitry 450 facilitates and/or effectuates read and write operations performed on the 3D memory array 260. For example, data can be stored to storage elements coupled to a word line 300 and the circuitry 450 can read bit values from the memory cells 301.

The physical block circuitry 450 also includes a sense amplifier and data latch, as well as drivers and power supplies for the sense amplifier and data latch. One power supply for the sense amplifier, a VHSA generator, and one power supply for the data latch, a VDDSA generator, may be located at each side of the physical block circuitry.

SUMMARY

Example embodiments may address at least the above problems and/or disadvantages and other disadvantages not described above. Also, example embodiments are not required to overcome the disadvantages described above, and may not overcome any of the problems described above.

One or more example embodiments may provide a memory device comprising: a memory array; and physical block circuitry, comprising a first lateral network arrangement and a second lateral network arrangement. Each of the first lateral network and the second lateral network may comprise: a generator configured to output a sense amplifier voltage VHSA and a data latch voltage VDDSA in each of a first mode and a second mode. In the first mode, the generator may receive VHSA as a feedback signal and in the second mode, the generator may receive VDDSA as a feedback signal.

The peripheral block circuitry may perform a read operation and a program verify operation on the memory array in the first mode, and may perform a programming operation on the memory array in the second mode.

Each of the first lateral network arrangement and the second lateral network arrangement may also comprise a multiplexer configured to output a data latch programming signal in the first mode and to output an external voltage in the second mode.

Each of the first lateral network arrangement and the second lateral network arrangement may further comprise a multiplexer which outputs VHSA to the generator in the first mode and outputs VDDSA to the generator in the second mode.

Each of the first lateral network arrangement and the second lateral network arrangement may further comprise a current limiter configured to be disabled in the first mode and configured to supply a voltage to a bit line of the memory array during a program operation in the second mode.

According to an aspect of another example embodiment, a lateral network arrangement of a memory device comprises a generator configured to output a sense amplifier voltage VHSA and a data latch voltage VDDSA in each of a first mode and a second mode. In the first mode, the generator may receive VHSA as a feedback signal and in the second mode, the generator may receive VDDSA as a feedback signal.

The lateral network arrangement may further comprise a multiplexer configured to output a data latch programming signal in the first mode and to output an external voltage in the second mode.

The lateral network arrangement may further comprise a current limiter configured to be disabled in the first mode and configured to supply a voltage to a bit line of the memory array during the program operation in the second mode.

According to an aspect of an example embodiment, physical block circuitry of a memory device comprises: peripheral circuitry; and a first lateral network arrangement and a second lateral network arrangement, each comprising: a generator configured to output a sense amplifier voltage VHSA and a data latch voltage VDDSA in each of a first mode and a second mode. In the first mode, the generator may receive VHSA as a feedback signal and in the second mode, the generator may receive VDDSA as a feedback signal.

The peripheral block circuitry may perform a read operation and a program verify operation on a memory array of the memory device in the second mode.

The peripheral block circuitry may perform a programming operation on a memory array of the memory device in the first mode.

Each of the first lateral network arrangement and the second lateral network arrangement may further comprise a multiplexer configured to output a data latch programming signal in the first mode and to output an external voltage in the second mode.

Each of the first lateral network arrangement and the second lateral network arrangement may further comprise a multiplexer which outputs VHSA to the generator in the first mode and outputs VDDSA to the generator in the second mode.

Each of the first lateral network arrangement and the second lateral network arrangement may further comprise a current limiter configured to be disabled in the first mode and configured to supply a voltage to a bit line of the memory array during the program operation in the second mode.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
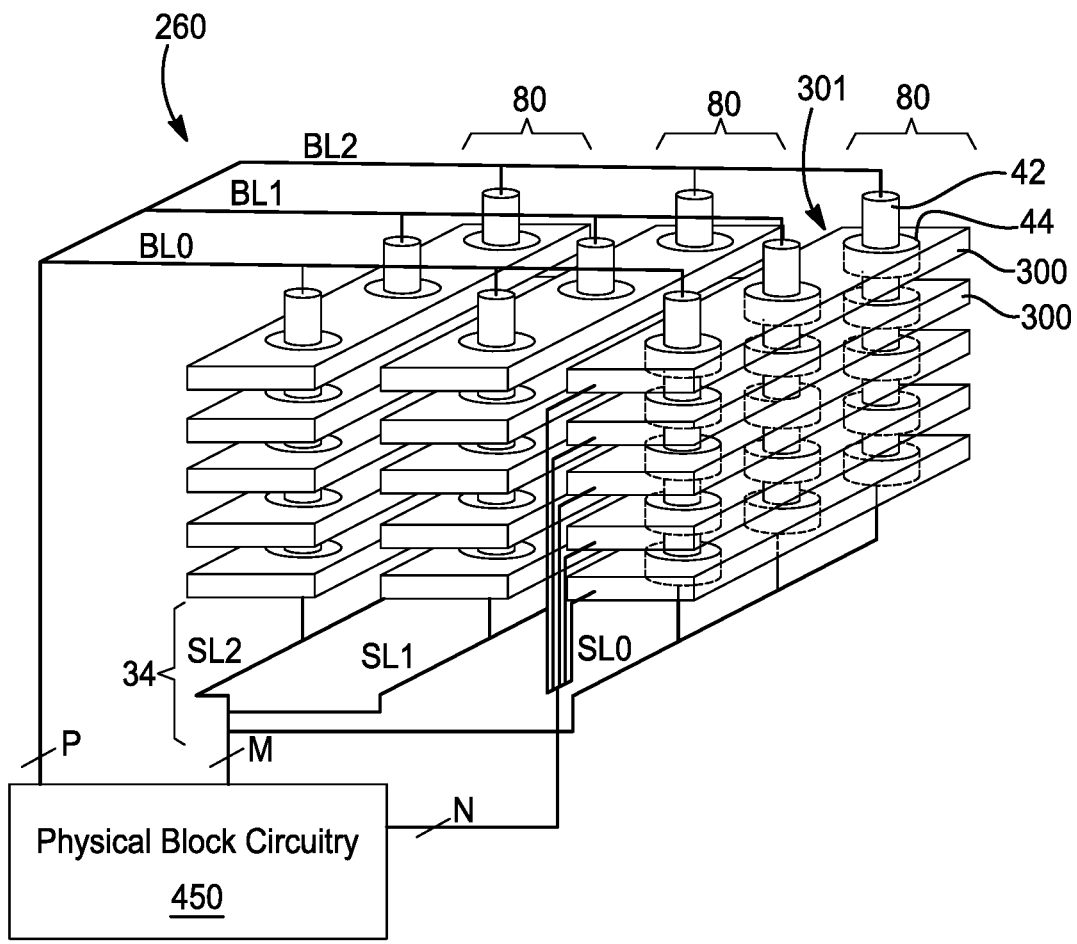
FIG. 1 is a diagram of an example 3D NAND memory.

Reference will now be made in detail to example embodiments which are illustrated in the accompanying drawings, wherein like reference numerals refer to like elements throughout. In this regard, the example embodiments may have different forms and may not be construed as being limited to the descriptions set forth herein.

It will be understood that the terms "include," "including", "comprise, and/or "comprising," when used in this specification, specify the presence of stated features, integers, steps, operations, elements, and/or components, but do not preclude the presence or addition of one or more other features, integers, steps, operations, elements, components, and/or groups thereof.

It will be further understood that, although the terms "first," "second," "third," etc., may be used herein to describe various elements, components, regions, layers and/or sections, these elements, components, regions, layers and/or sections may not be limited by these terms. These terms are only used to distinguish one element, component, region, layer or section from another element, component, region, layer or section.

As used herein, the term "and/or" includes any and all combinations of one or more of the associated listed items. Expressions such as "at least one of," when preceding a list of elements, modify the entire list of elements and do not modify the individual elements of the list. In addition, the terms such as "unit," "-er (-or)," and "module" described in the specification refer to an element for performing at least one function or operation, and may be implemented in hardware, software, or the combination of hardware and software.

Various terms are used to refer to particular system components. Different companies may refer to a component by different names—this document does not intend to distinguish between components that differ in name but not function.

Matters of these example embodiments that are obvious to those of ordinary skill in the technical field to which these example embodiments pertain may not be described here in detail.

This description references 3D NAND memory devices. However, it should be understood that the description herein may be likewise applied to other memory devices.

As used herein, the term "memory" denotes semiconductor memory. Types of semiconductor memory include volatile memory and non-volatile memory. Non-volatile memory allows information to be stored and retained even when the non-volatile memory is not connected to a source of power (e.g., a battery). Examples of non-volatile memory include, but are not limited to, flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), spin-transfer torque magnetic random access memory (STT-RAM or STT-MRAM), resistive random access memory (e.g., ReRAM or RRAM) and phase change memory (e.g., PRAM or PCM).

Figure 2:
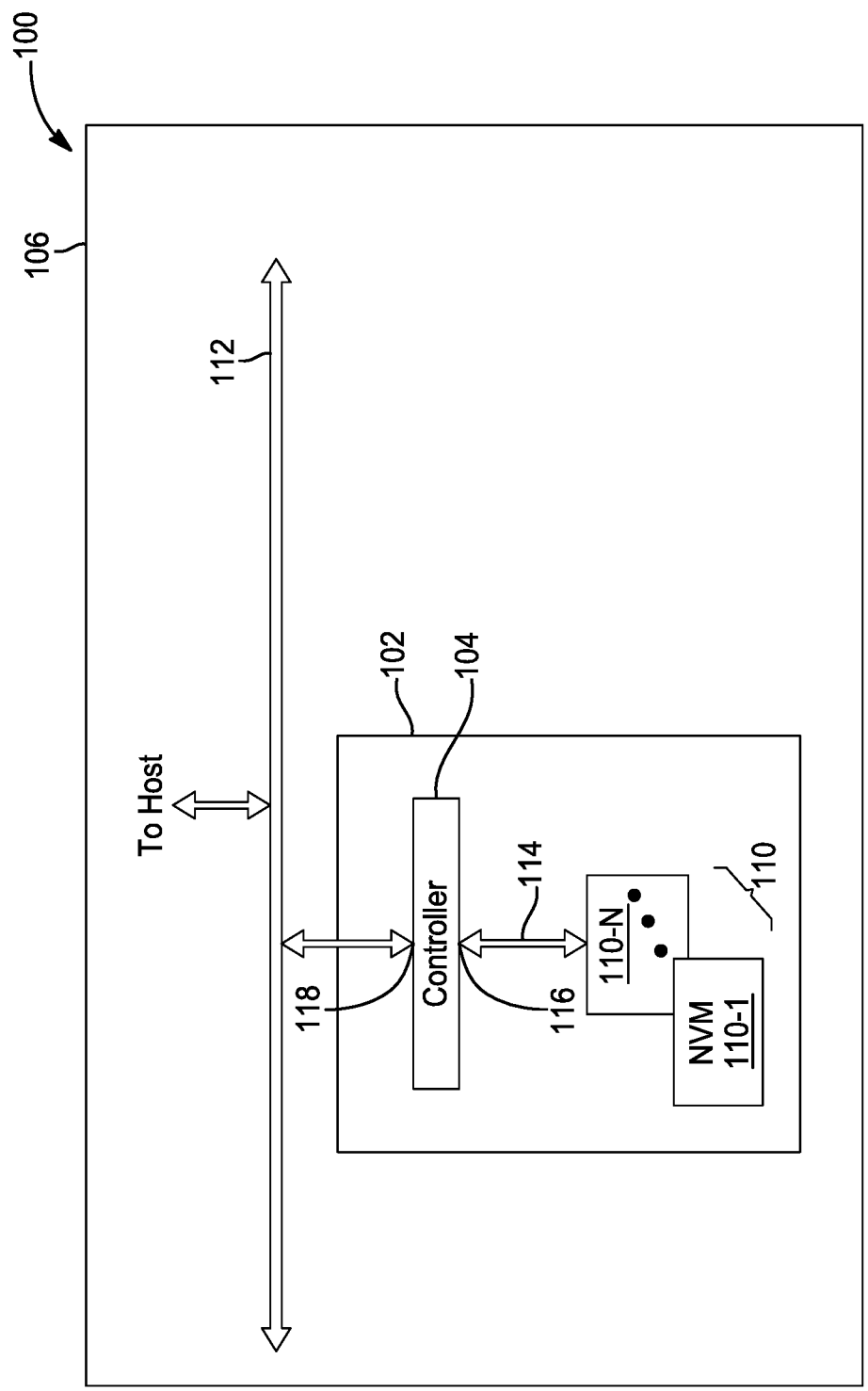
FIG. 2 is a block diagram of an example system architecture.

FIG. 2 illustrates a block diagram of an example system architecture 100 including non-volatile memory 110. In particular, the example system architecture 100 includes a storage system 102 that further includes a controller 104 communicatively coupled to a host 106 by a bus 112. The bus 112 implements any known or after developed communication protocol that enables the storage system 102 and the host 106 to communicate. Some non-limiting examples of a communication protocol include Secure Digital (SD) protocol, Memory Stick (MS) protocol, Universal Serial Bus (USB) protocol, and Advanced Microcontroller Bus Architecture (AMBA).

The controller 104 has at least a first port 116 coupled to the non-volatile memory (NVM) 110, by way of a communication interface 114. The memory 110 is disposed within the storage system 102. The controller 114 couples the host 106 by way of a second port 118 and the bus 112. The first and second ports 116 and 118 of the controller may each include one or more channels that couple to the memory 110 or the host 106, respectively.

The memory 110 of the storage system 102 includes several memory die 110-1-110-N. The manner in which the memory 110 is defined with respect to FIG. 2 is not meant to be limiting. In some example embodiments, the memory 110 defines a physical set of memory die, such as memory die 110-1-110-N. In other example embodiments, the memory 110 defines a logical set of memory die, where the memory 110 includes memory die from several physically different sets of memory die. The memory die 110 include non-volatile memory cells, such as, for example, those described above with respect to FIG. 1, that retain data even when there is a disruption in the power supply. Thus, the storage system 102 can be easily transported and the storage system 102 can be used in memory cards and other memory devices that are not always connected to a power supply.

In various example embodiments, the memory cells in the memory die 110 are solid-state memory cells (e.g., flash), one-time programmable, few-time programmable, or many time programmable. Additionally, the memory cells in the memory die 110 may include single-level cells (SLC), multiple-level cells (MLC), or triple-level cells (TLC). In one or more example embodiments, the memory cells may be fabricated in a planar manner (e.g., 2D NAND flash) or in a stacked or layered manner (e.g., 3D NAND flash).

The controller 104 and the memory 110 are communicatively coupled by an interface 114 implemented by several channels (e.g., physical connections) communicatively coupled between the controller 104 and the individual memory die 110-1 through 110-N. The depiction of a single interface 114 is not meant to be limiting as one or more interfaces may be used to communicatively couple the same components. The number of channels over which the interface 114 is established may vary based on the capabilities of the controller 104. Additionally, a single channel may be configured to communicatively couple more than one memory die. Thus the first port 116 may couple one or several channels implementing the interface 114. The interface 114 implements any known or after developed communication protocol. In example embodiments in which the storage system 102 is a flash memory, the interface 114 is a flash interface, such as Toggle Mode 200, 400, or 800, or Common Flash Memory Interface (CFI).

In one or more example embodiments, the host 106 may include any device or system that utilizes the storage system 102—e.g., a computing device, a memory card, a flash drive. In some example embodiments, the storage system 102 is embedded within the host 106—e.g., a solid state disk (SSD) drive installed in a laptop computer. In additional embodiments, the system architecture 100 is embedded within the host 106 such that the host 106 and the storage system 102 including the controller 104 are formed on a single integrated circuit chip. In example embodiments in which the system architecture 100 is implemented within a memory card, the host 106 may include a built-in receptacle or adapters for one or more types of memory cards or flash drives (e.g., a USB port, or a memory card slot).

Although, the storage system 102 includes its own memory controller and drivers (e.g., controller 104), as will be described further below in FIG. 3A, the example described in FIG. 2 is not meant to be limiting. Other example embodiments of the storage system 102 include memory-only units that are instead controlled by software executed by a controller on the host 106 (e.g., a processor of a computing device controls—including error handling of— the storage unit 102). Additionally, any method described herein as being performed by the controller 104 may also be performed by the controller of the host 106.

Still referring to FIG. 2, the host 106 includes its own controller (e.g., a processor) configured to execute instructions stored in the storage system 102, and the host 106 accesses data stored in the storage system 102, referred to herein as "host data." The host data includes data originating from and pertaining to applications executed on the host 106. In one example, the host 106 accesses host data stored in the storage system 102 by providing a logical address to the controller 104 which the controller 104 converts to a physical address. The controller 104 accesses the data or particular storage location associated with the physical address and facilitates transfer of data between the storage system 102 and the host 106. According to one or more example embodiments in which the storage system 102 includes flash memory, the controller 104 formats the flash memory to ensure the memory is operating properly, maps out bad flash memory cells, and allocates spare cells to be substituted for future failed cells or used to hold firmware to operate the flash memory controller (e.g., the controller 104). Thus, the controller 104 may perform any of various memory management functions such as wear leveling (e.g., distributing writes to extend the lifetime of the memory blocks), garbage collection (e.g., moving valid pages of data to a new block and erasing the previously used block), and error detection and correction (e.g., read error handling).

Figure 3A:
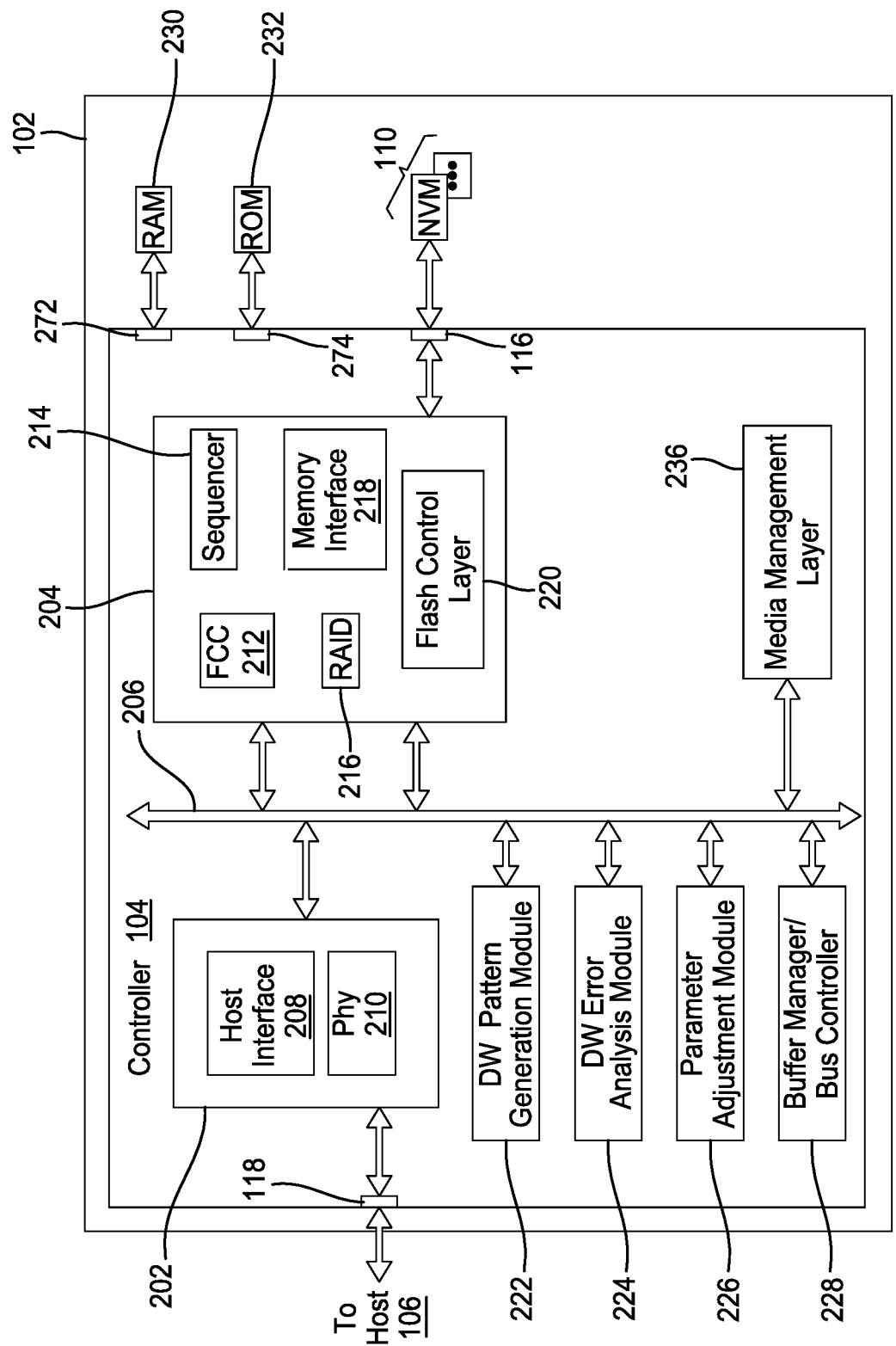
FIG. 3A is a block diagram of an example controller of FIG. 2.
Figure 3B:
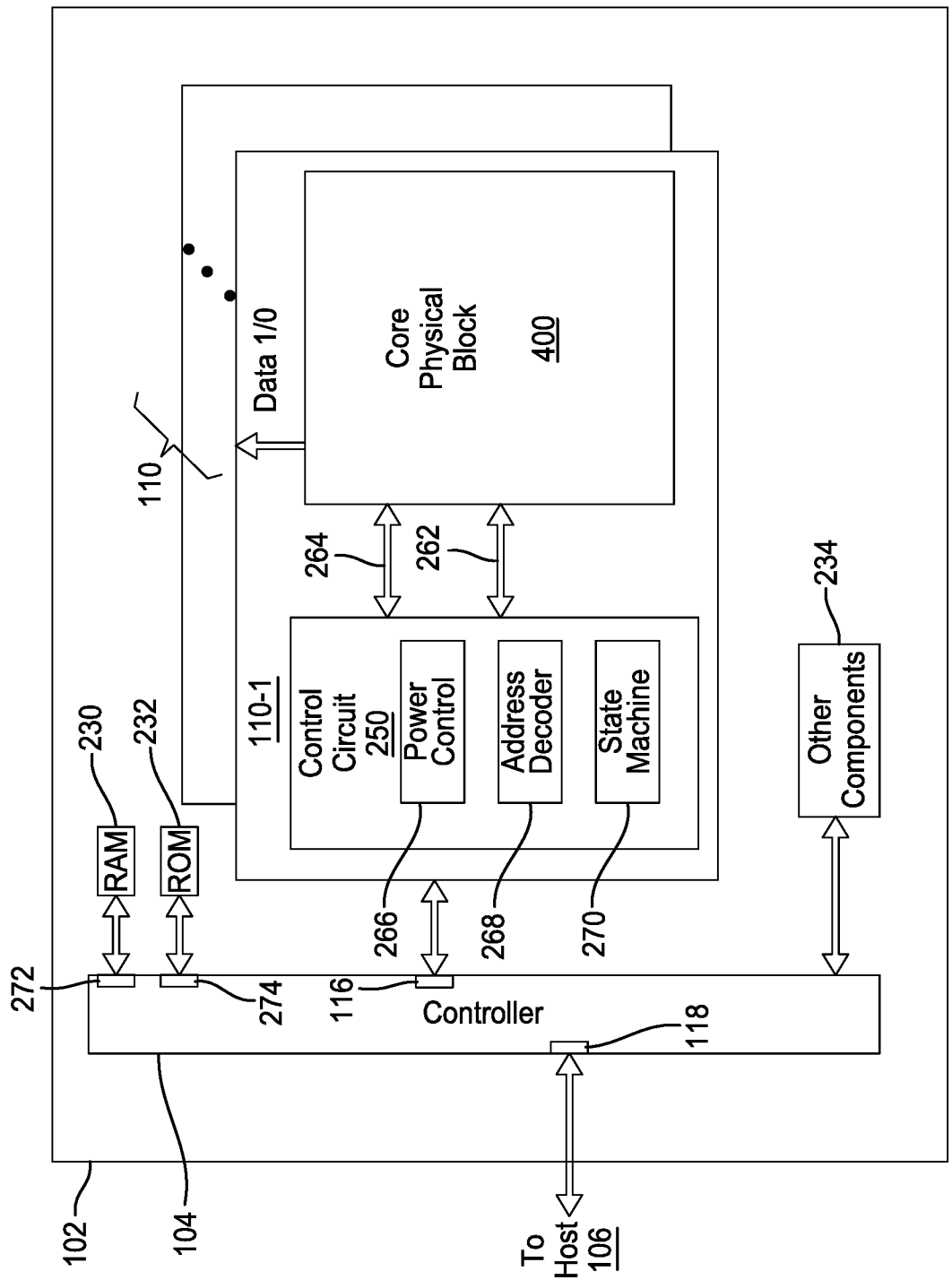
FIG. 3B is a block diagram of an example memory 110 of FIG. 2.

Additional details of the controller 104 and the memory 110 are described with respect to FIGS. 3A and 3B. Specifically, FIG. 3A shows, in block diagram form, additional details of the controller 104 of the storage system 102. FIG. 3A illustrates the previously-described controller 104, memory 110, and ports 116 and 118, and also illustrates a random access memory (RAM) 230 and a read only memory (ROM) 232. The RAM 230 and ROM 232 are respectively coupled to the controller 104 by a RAM port 272 and a ROM port 274.

Although the RAM 230 and the ROM 232 are shown as separate modules within the storage system 102, the illustrated architecture is not meant to be limiting. For example, the RAM 230 and the ROM 232 may be located within the controller 104. Alternately, portions of the RAM 230 and/or ROM 232, respectively, may be located outside the controller 104, while other portions of the RAM 230 and/or ROM 232 may be located within the controller 104. According to one or more example embodiments, the controller 104, the RAM 230, and the ROM 232 are located on separate semiconductor die.

The following discussion of the various modules depicted within the controller 104 are meant to be illustrative and not limiting. For example, the various modules described in FIG. 3A are not limited to being executed within the controller 104; one or more modules may be executed outside the controller 104. As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combinations thereof. According to one or more example embodiments, a module may include memory that stores instructions executable by a controller to implement a feature of the module. Thus, the controller can be configured by hardware and/or firmware to perform the various functions described herein.

The modules within the controller (e.g., modules 202 and 204) are communicatively coupled to each other by a bus 206. The module 202 interfaces with the host 106 and includes a host interface 208 and a physical layer interface 210 that provides the electrical interface between the host 106 or next level storage controller and the controller 104. The host interface 208 facilitates transfer of data, control signals, and timing signals. Examples of the host interface 208 include Serial Advanced Technology Attachment (SATA), SATA express, Serial Attached SCSI (SAS), Fibre Channel, USB, Peripheral Component Interconnect express (PCIe), and Non-Volatile Memory express (NVMe).

The module 204 is configured to communicate with the memory 110, by way of port 116, and includes an error correcting code (ECC) engine 212, a sequencer 214, a Redundant Array of Independent Drives (RAID) module 216, a flash control layer 220, and a memory interface 218. According to one or more example embodiments, the ECC engine 212 encodes host data received from the host 106 and stores the encoded host data in the memory 110. When the host data is read out from the memory 110, the ECC engine 212 decodes the host data and corrects errors detected within the host data. According to one or more example embodiments, the sequencer 214 may generate command sequences, such as program and erase command sequences that are transmitted to the memory 110.

The RAID module 216 generates RAID parity and recovery of failed data. The RAID parity can be used to provide an additional level of integrity protection for data written into the memory 110. According to one or more example embodiments, the ECC engine 212 may implement the functions of the RAID module 216. The memory interface 218 provides command sequences to the memory 110 and receives status information from the memory 110. For example, the memory interface 218 may implement any known or after developed communication protocol including a double data rate (DDR) interface, such as a Toggle Mode 200, 400, or 800. The flash control layer 220 controls the overall operation of the module 204.

Additional modules within the controller 104 may include a dummy word line (DW) pattern generation module 222, a DW error analysis module 224, and a parameter adjustment module 226. According to one or more example embodiments, the DW pattern generation module 222 may put a known data pattern into a dummy word line and track or periodically check for errors by reading the data back out of the dummy word line and comparing the data to the known data pattern. According to one or more example embodiments, the parameter adjustment module 226 may adjust parameters associated with a particular non-volatile memory die or more specifically a particular memory block.

The example controller 104 includes a buffer manager/bus controller 228 that manages, for example, buffers in the RAM 230 and controls the internal bus arbitration of the bus 206 in the controller 104. Additionally, the controller 104 may include a media management layer 236 that performs wear leveling of the memory 110. In an example embodiment in which the storage system 102 includes flash memory, the media management layer 236 may be integrated as part of a flash management that handles flash error and interfaces with the host 106. In particular, the media management layer 236 may include an algorithm (e.g., firmware in the memory device), that translates a write command received from the host 106 into a write to the memory 110.

FIG. 3B shows in block diagram form, various features and an example layout of the memory 110 within the storage system 102. The previously-described controller 104, RAM 230, and ROM 232, are included in FIG. 3B. Each of the features discussed in relation to the memory die 110-1 equally applies to all the memory die within the memory 110.

According to one or more example embodiments, the memory die 110-1 includes a control circuit 250 and a core physical block 400, including a memory array 260, and physical block circuitry 450. The example control circuit 250 includes a power control circuit 266, an address decoder 268, and a state machine 270 (collectively referred to herein as "managing circuits"). The control circuit 250 and its various managing circuits, are communicatively coupled to various interfaces (e.g., interfaces 262 and 264) to the physical block circuitry. According to one or more example embodiments, the control circuit 250 may perform various operations on the memory array 260 that include reading or writing to the memory cells by way of the physical block circuitry 450.

The power control circuit 266 controls the power and voltage supplied to the word lines and bit lines during operation of the memory array 260. The address decoder 268 provides an address interface that translates addresses between addresses provided by the host 106 and addresses used by a row decoder and a column decoder of the physical block circuitry, and vice versa. The state machine 270 provides chip-level control of memory operations.

The architecture of the memory die 110-1 is not meant to be limiting and any known architecture that can perform the functions of accessing the memory array 260 can be used without departing from the scope of this disclosure. For example, according to one or more example embodiments, access to the memory array 260 by various circuits may be implemented in a symmetric fashion on opposite sides of the memory array 260 which reduces the densities of access lines and circuitry on each side of the memory array 260.

The example memory array 260 may be a 3D NAND memory as discussed above with respect to FIG. 1. Alternately, the memory array 260 may include several memory blocks, arranged as a 2D array.

Figure 4:
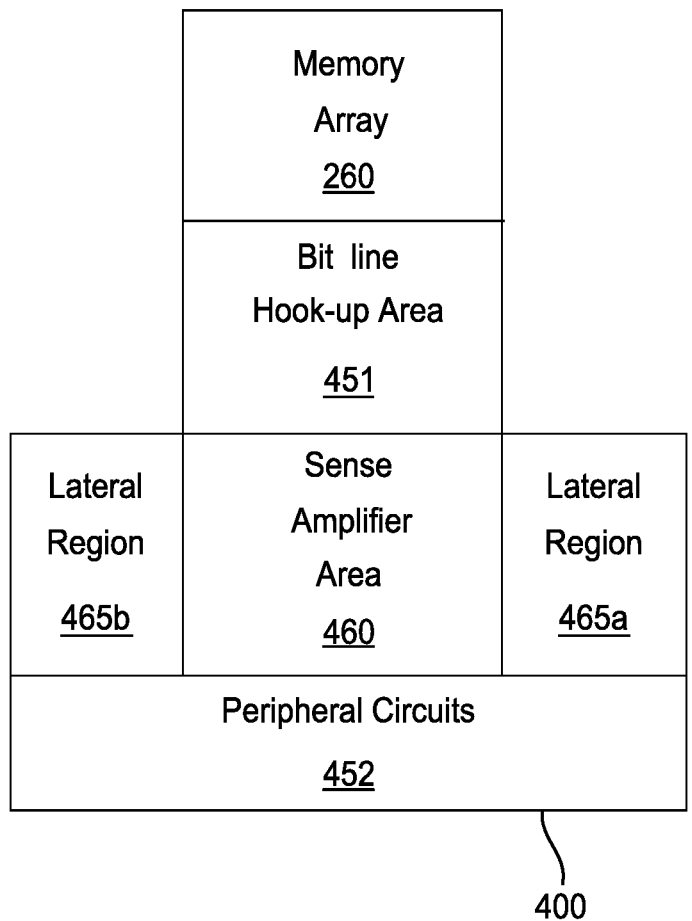
FIG. 4 is a block diagram of a cross-section of a core physical block, according to an example embodiment.

FIG. 4 illustrates a block diagram of a cross-section of the memory array 260 and physical block circuitry 450 making up the core physical block 400. The physical block circuitry includes a bit line hook-up array 451, a sense amplifier area 460, lateral regions 465a and 465b, disposed on either side of the sense amplifier area 460, and peripheral circuits 452. Among other elements, driving circuitry and power supply for the sense amplifier area 460 and data latches are disposed in each of these lateral regions 465.

Figure 5A:
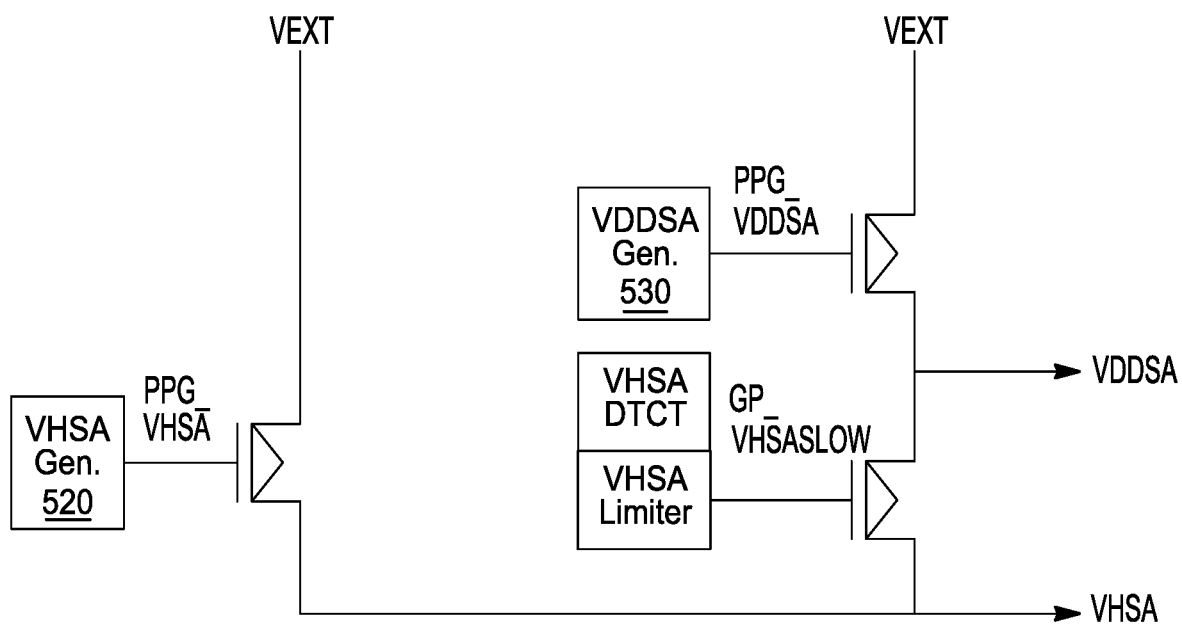
FIG. 5A is a circuit diagram of a VHSA/VDDSA network arrangement according to the related art.

FIG. 5A is a circuit diagram of a VHSA/VDDSA network arrangement 500 according to the related art. One VDDSA generator 530 and one VHSA generator 520 are provided in the network arrangement 500, and one network arrangement 500 is provided in each of the lateral regions 465. Separate VDDSA and VHSA generators 530 and 520 are provided on each lateral region 465 in order to provide a strong VDDSA and VHSA power bus for the sense amplifier and data latch power supply.

Figure 5B:
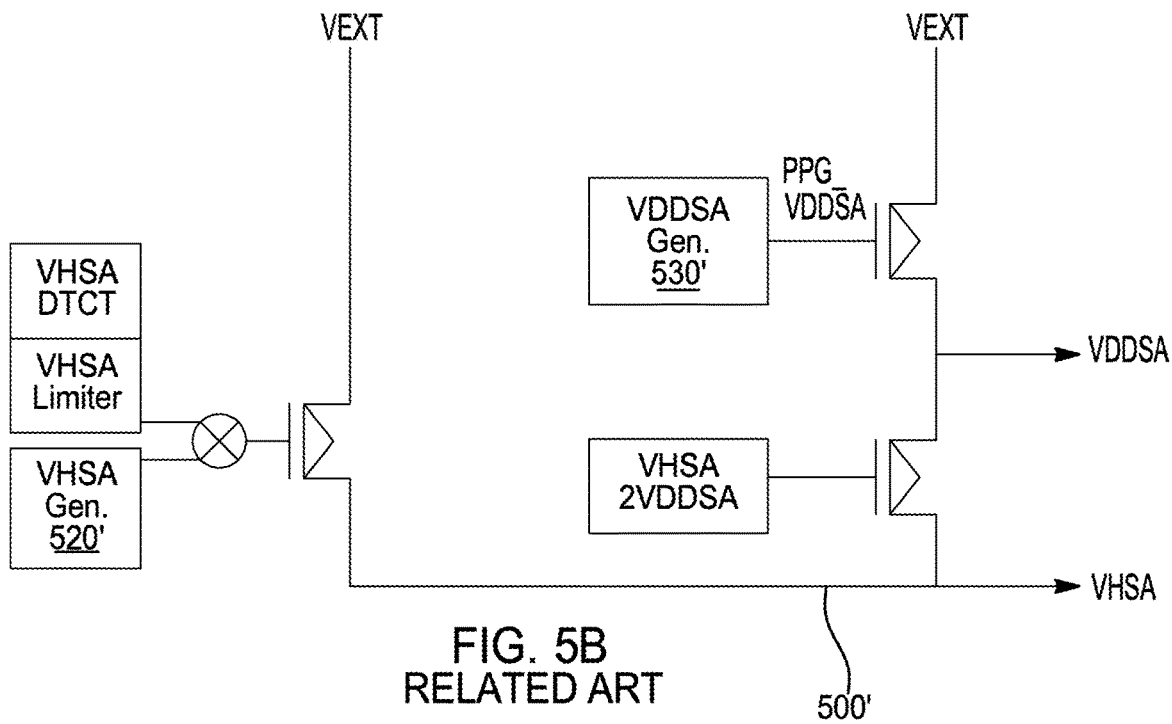
FIG. 5B is a circuit diagram of another VHSA/VDDSA network arrangement according to the related art.

FIG. 5B is a circuit diagram of another VHSA/VDDSA network arrangement 500' according to the related art. As shown, similar to the arrangement of FIG. 5A, one VHSA generator 520' and one VDDSA generator 530' are provided in the network arrangement 500', and one network arrangement 500' is provided in each lateral region 465.

According to current technologies, and designs, the area available for lateral regions is very limited. However, decreasing the area of the lateral regions is challenging.

During normal operation of a memory device, the voltage provided to the data latch, VDDSA, and the voltage provided to the sense amplifier, VHSA, have the same target level and are connected during read/program verify and other operations. Thus, according to one or more example embodiments, the area required for the lateral regions may be reduced, while saving Icc, by providing a VHSA/VDDSA network arrangement including only one VDDSA generator which provides a driving voltage to both the data latch and the sense amplifier.

Figure 6:
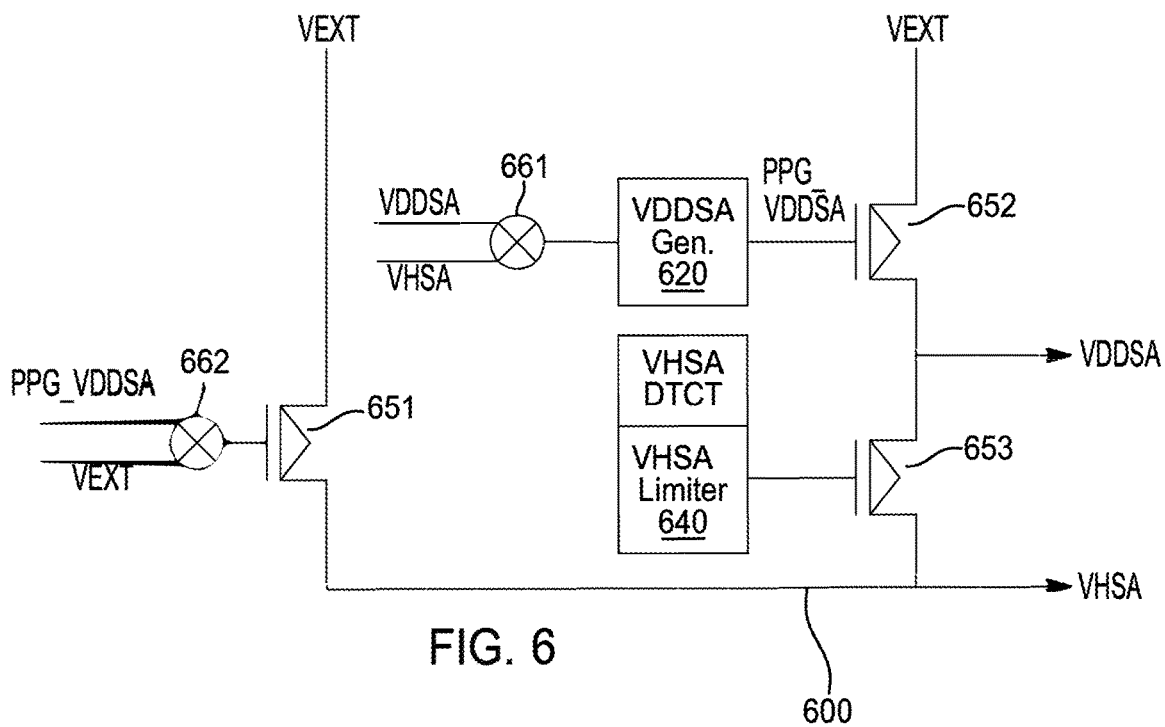
FIG. 6 is a circuit diagram of a VHSA/VDDSA network arrangement according to an example embodiment.

FIG. 6 is a circuit diagram of a VHSA/VDDSA network arrangement 600 according to an example embodiment. As shown, the network arrangement 600 includes only a single VDDSA generator 620, and no separate VHSA generator, thus enabling a decrease in the area required in the lateral area for the network arrangement 600. The network arrangement 600, as shown in FIG. 6, also includes P-type metal-oxide-semiconductor (PMOS) transistors 651, 652, and 653, and multiplexers (MUX) 661 and 662.

The VHSA/VDDSA network arrangement 600 operates in two modes: a first, "normal" mode, which is operational during read and program verify, and other operations, and a second mode, which is operational during programming, POR, and EVFY operations.

In the first mode, the current loads of the VDDSA and the VHSA are the same, the target level for VDDSA and the target level for VHSA are the same. VHSA is used for feedback for the generator 620. During the first mode, the signal for enabling the VHSA limiter VHSASLOW_V=0, and the VHSA limiter is disabled.

During a program operation in the second mode, and the VDDSA control signal (PPG_VDDSA) is used as the control signal (PPG_VHSA) for the VHSA power, and the VHSA has a large current load which causes the VHSA to drop to a lower level than VDDSA. The external voltage (VEXT) is used as PPG_VHSA, and the VHSA limiter 640 is enabled. The VHSA limiter is used to charge the bit line, and the limit current is controlled by the gate control signal for the VHSA limiter, the GP_VHSASLOW signal. At this time, the VHSA driver is disabled. VHSA cannot be used for feedback for the generator 620, as it would result in an incorrect bias. Rather, during this second mode, when VHSASLOW_V is high, and the VHSA limiter is enabled, VDDSA is used for generator feedback.

It may be understood that the example embodiments described herein may be considered in a descriptive sense only and not for purposes of limitation. Descriptions of features or aspects within each example embodiment may be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:

1. A memory device comprising:
   a memory array; and
   physical block circuitry, comprising a first lateral network arrangement and a second lateral network arrangement, each comprising:
   a generator configured to output a sense amplifier voltage VHSA and a data latch voltage VDDSA in each of a first mode and a second mode;
   wherein, in the first mode, the generator receives VHSA as a feedback signal and in the second mode, the generator receives VDDSA as a feedback signal.

2. The memory device according to claim 1, wherein the peripheral block circuitry is configured to perform a read operation and a program verify operation on the memory array in the first mode.

3. The memory device according to claim 1, wherein the peripheral block circuitry is configured to perform a programming operation on the memory array in the second mode.

4. The memory device according to claim 1, wherein each of the first lateral network arrangement and the second lateral network arrangement further comprises a multiplexer configured to output a data latch programming signal in the first mode and to output an external voltage in the second mode.

5. The memory device according to claim 1, wherein each of the first lateral network arrangement and the second lateral network arrangement further comprises a multiplexer which outputs VHSA to the generator in the first mode and outputs VDDSA to the generator in the second mode.

6. The memory device according to claim 1, wherein each of the first lateral network arrangement and the second lateral network arrangement further comprises a current limiter configured to be disabled in the first mode and configured to supply a voltage to a bit line of the memory array during a program operation in the second mode.

7. A lateral network arrangement of a memory device, the lateral network arrangement comprising:
   a generator configured to output a sense amplifier voltage VHSA and a data latch voltage VDDSA in each of a first mode and a second mode;
   wherein, in the first mode, the generator receives VHSA as a feedback signal and in the second mode, the generator receives VDDSA as a feedback signal.

8. The lateral network arrangement of claim 6, further comprising a multiplexer configured to output a data latch programming signal in the first mode and to output an external voltage in the second mode.

9. The lateral network arrangement of claim 6, further comprising a current limiter configured to be disabled in the first mode and configured to supply a voltage to a bit line of the memory array during the program operation in the second mode.

10. Physical block circuitry of a memory device, the physical block circuitry comprising:
peripheral circuitry;
a first lateral network arrangement and a second lateral network arrangement, each comprising:
a generator configured to output a sense amplifier voltage VHSA and a data latch voltage VDDSA in each of a first mode and a second mode;
wherein, in the first mode, the generator receives VHSA as a feedback signal and in the second mode, the generator receives VDDSA as a feedback signal.

11. The memory device according to claim 10, wherein the peripheral block circuitry is configured to perform a read operation and a program verify operation on a memory array of the memory device in the second mode.

12. The memory device according to claim 10, wherein the peripheral block circuitry is configured to perform a programming operation on a memory array of the memory device in the first mode.

13. The memory device according to claim 10, wherein each of the first lateral network arrangement and the second lateral network arrangement further comprises a multiplexer configured to output a data latch programming signal in the first mode and to output an external voltage in the second mode.

14. The memory device according to claim 10, wherein each of the first lateral network arrangement and the second lateral network arrangement further comprises a multiplexer which outputs VHSA to the generator in the first mode and outputs VDDSA to the generator in the second mode.

15. The memory device according to claim 10, wherein each of the first lateral network arrangement and the second lateral network arrangement further comprises a current limiter configured to be disabled in the first mode and configured to supply a voltage to a bit line of the memory array during a program operation in the second mode.

* * * * *